(12) United States Patent
Sun

(10) Patent No.: US 9,190,432 B2
(45) Date of Patent: Nov. 17, 2015

(54) OXIDE THIN-FILM TRANSISTOR ARRAY SUBSTRATE, MANUFACTURING METHOD THEREOF AND DISPLAY PANEL

(71) Applicant: BOE TECHNOLOGY GROUP CO., LTD., Beijing (CN)

(72) Inventor: Shuang Sun, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/355,330

(22) PCT Filed: Apr. 24, 2013

(86) PCT No.: PCT/CN2013/074633
§ 371 (c)(1),
(2) Date: Apr. 30, 2014

(87) PCT Pub. No.: WO2014/131236
PCT Pub. Date: Sep. 4, 2014

(65) Prior Publication Data
US 2015/0102339 A1    Apr. 16, 2015

(30) Foreign Application Priority Data

Feb. 28, 2013 (CN) .......................... 2013 1 0063256

(51) Int. Cl.
*H01L 27/12* (2006.01)

(52) U.S. Cl.
CPC .......... *H01L 27/1288* (2013.01); *H01L 27/124* (2013.01); *H01L 27/127* (2013.01); *H01L 27/1225* (2013.01)

(58) Field of Classification Search
CPC ................... H01L 29/7869; H01L 21/02554; H01L 27/1288; H01L 29/78696; H01L 21/02664; H01L 27/1225; H01L 27/124; H01L 27/127
See application file for complete search history.

(56) References Cited

U.S. PATENT DOCUMENTS

| | | | |
|---|---|---|---|
| 5,920,083 | A | 7/1999 | Bae |
| 6,970,209 | B2 | 11/2005 | Jun |
| 7,763,481 | B2 | 7/2010 | Yang et al. |
| 2002/0037646 | A1 | 3/2002 | Lyu |
| 2011/0007234 | A1* | 1/2011 | Liu et al. .......................... 349/43 |
| 2011/0156025 | A1* | 6/2011 | Shionoiri et al. ................ 257/43 |

(Continued)

FOREIGN PATENT DOCUMENTS

| | | |
|---|---|---|
| CN | 1991456 A | 7/2007 |
| CN | 101350330 A | 1/2009 |
| CN | 102543754 A | 7/2012 |

(Continued)

OTHER PUBLICATIONS

Chinese Office Action of Chinese Application No. 201310063256.2 with English translation, mailed Jul. 17, 2014.

(Continued)

*Primary Examiner* — Whitney T Moore
(74) *Attorney, Agent, or Firm* — Collard & Roe, P.C.

(57) ABSTRACT

An oxide thin-film transistor (TFT) array substrate, a manufacturing method thereof and a display panel are provided. In the manufacturing method, a pattern of a gate insulating layer (13), an oxide active layer (14) and an etch barrier layer (15) is formed on a substrate (10) on which a pattern of a gate line (11) and a gate electrode (12) is formed, by one patterning process.

17 Claims, 6 Drawing Sheets

(56) References Cited

U.S. PATENT DOCUMENTS

2012/0086678 A1    4/2012    Chang et al.
2013/0302939 A1    11/2013    Liu et al.

FOREIGN PATENT DOCUMENTS

| CN | 102637648 A | 8/2012 |
| --- | --- | --- |
| CN | 102651341 A | 8/2012 |
| CN | 102709237 A | 10/2012 |
| CN | 102779784 A | 11/2012 |
| CN | 203218263 U | 9/2013 |

OTHER PUBLICATIONS

International Search Report, International Preliminary Report on Patentability and Written Opinion of the International Searching Authority of PCT/CN2013/074633. in Chinese, mailed Dec. 19, 2013.

International Preliminary Report on Patentability and Written Opinion of the International Searching Authority of PCT/CN2013/074633 in English, mailed in Chinese on Dec. 19, 2013.

\* cited by examiner

OXIDE THIN-FILM TRANSISTOR ARRAY SUBSTRATE, MANUFACTURING METHOD THEREOF AND DISPLAY PANEL

CROSS REFERENCE TO RELATED APPLICATIONS

This application is the National Stage of PCT/CN2013/074633 filed on Apr. 24, 2013, which claims priority under 35 U.S.C. §119 of Chinese Application No. 201310063256.2 filed on Feb. 28, 2013, the disclosure of which is incorporated by reference. The international application under PCT article 21(2) was not published in English.

TECHNICAL FIELD

Embodiments of the present invention relate to an oxide thin-film transistor (TFT) array substrate, a manufacturing method thereof and a display panel.

BACKGROUND

The carrier mobility of an oxide active layer, such as, an indium gallium zinc oxide (IGZO) active layer, is 20 to 30 times of that of amorphous silicon. The oxide active layer can greatly improve the charge and discharge rate of a TFT to a pixel electrode, improve the response speed of a pixel, and obtain faster refresh rate, and is a channel layer material applied to a new generation of thin-film transistor liquid crystal display (TFT-LCD) technology.

In the prior art, a manufacturing of an oxide TFT array substrate generally requires at least six patterning processes. The specific process is as follows:

1. forming a pattern of a gate electrode and a gate line by a first patterning process;
2. forming a pattern, of a gate insulating layer and an oxide active layer by a second patterning process;
3. forming a pattern of an etch barrier layer by a third patterning process;
4. forming a pattern of a data line, a source electrode, a drain electrode and a TFT channels by a fourth patterning process;
5. forming a pattern of a passivation layer by a fifth patterning process; and
6. forming a pixel electrode by a sixth patterning process.

However, each patterning process requires processes such as coating, photolithography, etching and removing. Therefore, the oxide TFT array substrate has long production period, complex production process and high cost.

SUMMARY

Embodiments of the present invention provide an oxide TFT array substrate, a manufacturing method thereof and a display panel, which can reduce the number of patterning processes of the oxide TFT array substrate, simplify the production process and reduce the production cost.

In order to achieve the objective, the embodiments of the present invention adopt the following technical solution.

In one aspect, the embodiment of the present invention provides a manufacturing method of an oxide TFT array substrate. The method comprises: forming a pattern comprising a gate insulating layer, an oxide active layer and an etch barrier layer on a substrate on which a pattern of a gate line and a gate electrode is formed, by one patterning process.

In one example, the forming the pattern comprising the gate insulating layer, the oxide active layer and the etch barrier layer on the substrate on which the pattern of the gate line and the gate electrode is formed, by one patterning process comprises: forming a gate insulating layer film, an oxide active layer film and an etch barrier layer film on the substrate on which the pattern of the gate line and the gate electrode is formed in sequence; coating a photoresist on the substrate on which the gate insulating layer film, the oxide active layer film and the etch barrier layer film are formed; exposing the photoresist by a half-tone mask or a gray-tone mask and forming a photoresist-completely-retained region, a photoresist-half-retained region and a photoresist-completely-removed region after developing, wherein in a pixel unit, the photoresist-completely-retained region corresponds to a region of a pattern of the etch barrier layer, the photoresist-half-retained region corresponds to a region of a pattern of the oxide active layer except the region of the pattern of the etch barrier layer, and the photoresist-completely-removed region corresponds to a region except the photoresist-completely-retained region and the photoresist-half-retained region; removing the oxide active layer film and the etch barrier layer film in the photoresist-completely-removed region by an etching process, and forming the pattern of the oxide active layer; removing the photoresist in the photoresist-half-retained region by an ashing process; removing the etch barrier layer film in the photoresist-half-retained regions by an etching process, and forming the pattern of the etch barrier layer; and removing the photoresist in the photoresist-completely-retained region to expose the etch barrier layer and the oxide active layer.

In one example, before the forming the pattern comprising the gate insulating layer, the oxide active layer and the etch barrier layer, the method further comprises: forming the pattern of the gate line and the gate electrode on the substrate by one patterning process, and meanwhile forming a data line initial pattern, which is intersected with the gate line and disconnected at positions at which the data line initial pattern is intersected and overlapped with the gate line, by the one patterning process; and forming at least one data line connecting through hole above each section of the disconnected data line initial pattern by the patterning process, in the patterning process of forming the gate insulating layer, the oxide active layer and the etch barrier layer. And after the forming the pattern comprising the gate insulating layer, the oxide active layer and the etch barrier layer, the method further comprises: forming a pattern comprising a data line, a source electrode, a drain electrode, a connecting electrode and a pixel electrode on the substrate on which the pattern comprising the gate insulating layer, the oxide active layer and the etch barrier layer is formed, by a patterning process, in which every two adjacent sections of the disconnected data line initial pattern are connected with each other by the connecting electrode through every two adjacent data line connecting through holes in a direction intersected with the gate line, and hence a pattern of the data line is formed; and the source electrode is connected with the data line and the drain electrode is connected with the pixel electrode.

In one example, the forming the pattern comprising the gate line and the gate electrode on the substrate by one patterning process, and meanwhile forming the data line initial pattern, which is intersected with the gate line and disconnected at positions at which the data line initial pattern is intersected and overlapped with the gate line, by the one patterning process comprises: forming a gate metal layer film on the substrate; coating a photoresist on the substrate on which the gate metal layer film is formed; exposing the photoresist by a mask and forming a photoresist-completely-removed region and a photoresist-completely-retained region after developing, in which in a pixel unit, the photoresist-completely-retained region corresponds to the pattern of the gate line and the gate electrode and the data line initial pattern; and the photoresist-completely-removed region corresponds to a region except the photoresist-completely-retained region; removing the gate metal layer film in the photoresist-completely-removed region by an etching process; and removing the photoresist in the photoresist-completely-retained region to expose the pattern of the gate line and the gate electrode and the data line initial pattern.

In one example, the forming at least one data line connecting through hole above each section of the disconnected data line initial pattern by the patterning process, in the patterning process of forming the gate insulating layer, the oxide active layer and the etch barrier layer, comprises: forming a gate insulating layer film, an oxide active layer film and an etch barrier layer film on the substrate on which the pattern of the gate line and the gate electrode and the data line initial pattern are formed; coating a photoresist on the substrate on which the gate insulating layer film, the oxide active layer film and the etch barrier layer film are formed; exposing the photoresist by a gray-tone mask and forming a photoresist-completely-retained region, a photoresist-partially-retained region with a first thickness, a photoresist-partially-retained region with a second thickness and a photoresist-completely-removed region after developing, in which in a pixel unit, the photoresist-completely-retained region corresponds to a region of a pattern of the etch barrier layer; the photoresist-partially-retained region with the first thickness corresponds to a region of the pattern of the oxide active layer except the pattern of the etch barrier layer; the photoresist-completely-removed region corresponds to a region of a pattern of the data line connecting through holes; the photoresist-partially-retained region with the second thickness corresponds to a region except the photoresist-completely-retained region, the photoresist-partially-retained region with the first thickness and the photoresist-completely-removed region; and the first thickness is greater than the second thickness; removing the gate insulating layer film, the oxide active layer film and the etch barrier layer film in the photoresist-completely-removed region by an etching process, and forming the pattern of the data line connecting through holes; removing the photoresist in the photoresist-partially-retained regions with the second thickness by an ashing process; removing the oxide active layer film and the etch barrier layer film in the photoresist-partially-retained region with the second thickness by an etching process, and forming the pattern of the oxide active layer; removing the photoresist in the photoresist-partially-retained regions with the first thickness by an ashing process; removing the etch barrier layer film in the photoresist-partially-retained region with the first thickness by an etching process, and forming the pattern of the etch barrier layer; and removing the photoresist in the photoresist-completely-retained region.

In one example, the forming at least one data line connecting through hole above each section of the disconnected data line initial pattern by the patterning process, in the patterning process of forming the gate insulating layer, the oxide active layer and the etch barrier layer, comprises: forming a gate insulating layer film, an oxide active layer film and an etch barrier layer film on the substrate on which the pattern of the gate line and the gate electrode and the data line initial pattern are formed; coating a photoresist on the substrate on which the gate insulating layer film, the oxide active layer film and the etch barrier layer film are formed; exposing the photoresist by a gray-tone mask and forming a photoresist-completely-retained region, a photoresist-half-retained region and a photoresist-completely-removed regions after developing, in which in a pixel unit, the photoresist-completely-retained region corresponds to a region of a pattern of the oxide active layer; the photoresist-completely-removed region corresponds to a region of a pattern of the data line connecting through holes; and the photoresist-half-retained region corresponds to a region except the photoresist-completely-retained region and the photoresist-completely-removed region; removing the gate insulating layer film, the oxide active layer film and the etch barrier layer film in the photoresist-completely-removed region by an etching process, and forming the pattern of the data line connecting through holes; removing the photoresist in the photoresist-half-retained regions by an ashing process; removing the oxide active layer film and the etch barrier layer film in the photoresist-half-retained region by an etching process to form the pattern of the oxide active layer; retaining a portion of the photoresist in the region of the pattern of the etch barrier layer and removing the photoresist in the photoresist-completely-retained region except the region of the pattern of the etch barrier layer, by the control of an ashing process conditions; removing the etch barrier layer film in the photoresist-completely-retained region except the region of the etch barrier layer by an etching process to form the pattern of the etch barrier layer; and removing the photoresist in the region of the pattern of the etch barrier layer.

In one example, the forming the pattern of the data line, the source electrode, the drain electrode, the connecting electrode and the pixel electrode on the substrate, on which the gate insulating layer, the oxide active layer and the etch barrier layer are formed, by a patterning process comprises: forming the pattern of the data line, the source electrode, the drain electrode, the connecting electrode and the pixel electrode by one patterning process.

In one example, the forming the pattern of the data line, the source electrode, the drain electrode, the connecting electrode and the pixel electrode by one patterning process comprises: forming a transparent conductive film on the substrate on which the gate insulating layer, the oxide active layer, the etch barrier layer and the data line connecting through holes are formed; coating a photoresist on the substrate on which the transparent conductive film is formed; exposing the photoresist by a mask and forming a photoresist-completely-retained region and a photoresist-completely-removed region after developing, in which in a pixel unit, the photoresist-completely-retained region corresponds to a region of the pattern of the source electrode, the drain electrode, the pixel electrode and the connecting electrode; the source electrode is connected with the data line and the drain electrode is connected with the pixel electrode; and the photoresist-completely-removed region corresponds to a region except the photoresist-completely-retained region; removing the transparent conductive film in the photoresist-completely-removed region by an etching process, and forming the pattern of the source electrode, the drain electrode and the pixel electrode; and removing the photoresist in the photoresist-completely-retained region.

In another aspect, the embodiment of the present invention provides an oxide TFT array substrate. The array substrate comprises: a substrate; a pattern of a gate line and a gate electrode, formed by a gate metal layer film and disposed on the substrate; a pattern of a gate insulating layer, an oxide active layer and an etch barrier layer, formed by a gate insulating layer film, an oxide active layer film and an etch barrier layer film respectively and disposed on the substrate on which the gate line and the gate electrode are formed; and a pattern of a data line, a source electrode, a drain electrode and a pixel electrode, formed on the substrate on which the gate insulating layer, the oxide active layer and the etch barrier layer are formed, in which the source electrode is connected with the data line and the drain electrode is connected with the pixel electrode.

In one example, a data line initial pattern which is formed by the gate metal layer film, intersected with the gate line and disconnected at positions at which the data line initial pattern is intersected and overlapped with the gate line is formed on the substrate; a pattern of at least one data line connecting through hole is formed above each section of the disconnected data line initial pattern, on the substrate on which the gate line and the gate electrode are formed; a patterns of a connecting electrode is also formed on the substrate on which the pattern of the gate insulating layer, the oxide active layer and the etch barrier layer is formed; and every two adjacent section of the disconnected data line initial pattern are connected with each other by each connecting electrode through every two adjacent data line connecting through holes in a direction intersected with the gate line, and hence a pattern of the data line is formed.

In one example, the source electrode, the drain electrode, the pixel electrode and the connecting electrode are formed by a transparent conductive film.

In one example, the gate line, the gate electrode and the data line initial pattern are disposed in the same layer.

In one example, the source electrode, the drain electrode, the pixel electrode and the connecting electrode are disposed in the same layer.

In still another aspect, the embodiment of the present invention provides a display panel, which comprises the oxide TFT array substrate provided by any one of the embodiments of the present invention.

In the oxide TFT array substrate, the manufacturing method thereof and the display panel provided by the embodiments of the present invention, the method comprises: forming a pattern comprising a gate insulating layer, an oxide active layer and an etch barrier layer on a substrate on which a pattern comprising a gate line and a gate electrode is formed, by one patterning process. In the manufacturing process of the oxide TFT array substrate, the pattern of the gate insulating layer, the oxide active layer and the etch barrier layer can be formed without three patterning processes. Therefore, the production period of the oxide TFT array substrate can be reduced; the production process can be simplified; and the production cost can be reduced.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It should be noted that the words "on" and "beneath" in an embodiment of the present invention are only used for illustrating the embodiments of the present invention with reference to the accompanying drawings and not used as a restrictive word.

A First Embodiment

Figure 1:
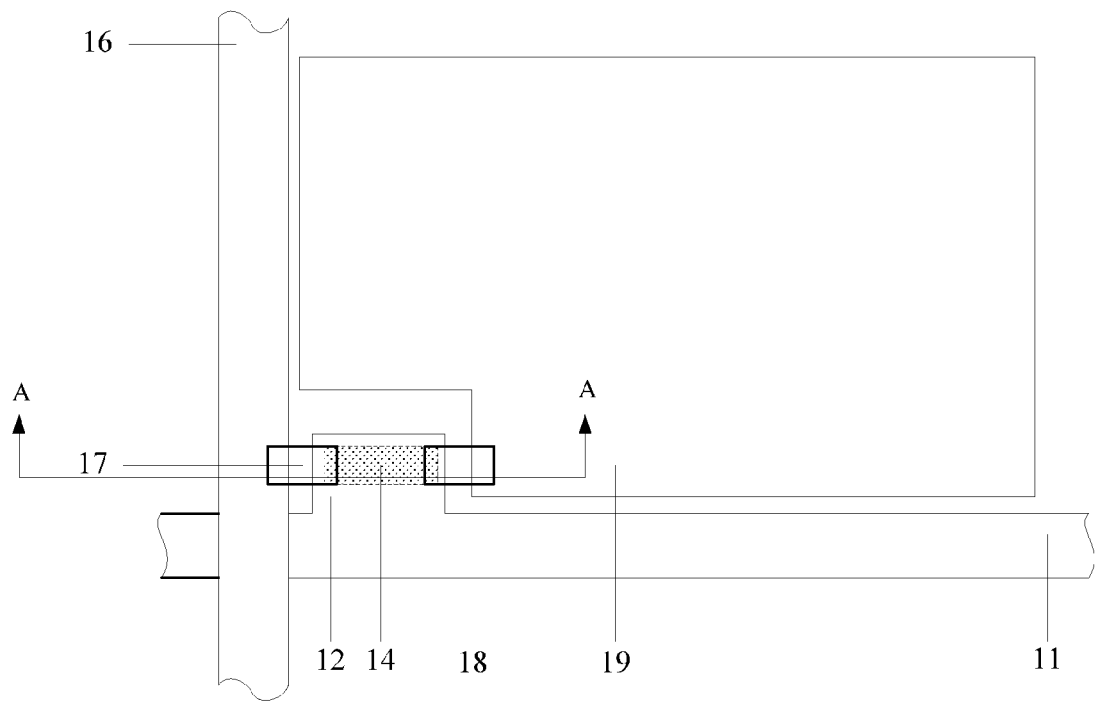
FIG. 1 is a schematic structural top view of an oxide TFT array substrate provided by an embodiment of the present invention.
Figure 1A:
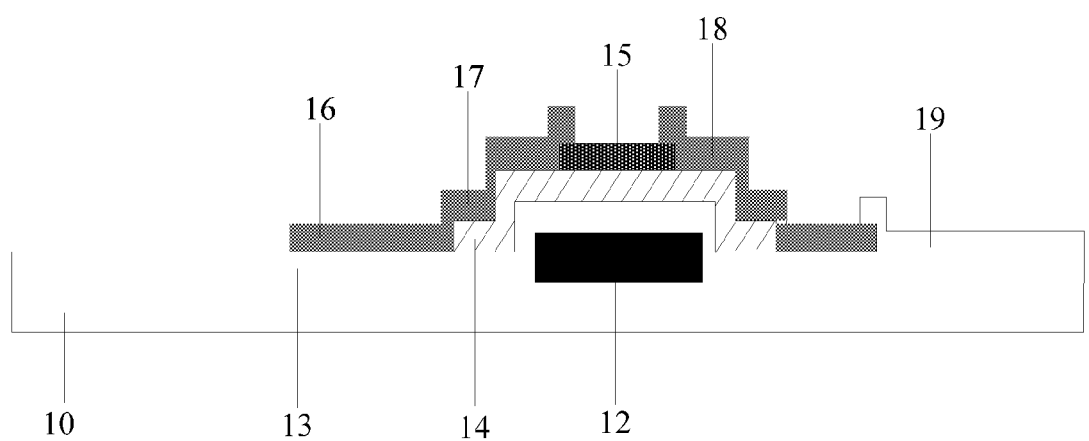
FIG. 1a is a schematic structural sectional view of the oxide TFT array substrate as shown in FIG. 1 along an A-A direction.

The first embodiment of the present invention provides an oxide TFT array substrate. Exemplarily, as illustrated in FIGS. 1 and 1a, a structure of the oxide TFT array substrate is described in detail by taking a single subpixel of a twisted nematic (TN) type oxide TFT array substrate as an example. The array substrate comprises: a substrate 10; a pattern comprising a gate line 11 and a gate electrode 12, formed by a gate metal layer film and disposed on the substrate 10; a pattern comprising a gate insulating layer 13, an oxide active layer 14 and an etch barrier layer 15, formed by a gate insulating layer film, an oxide active layer film and an etch barrier layer film respectively and disposed on the substrate on which the gate line 11 is formed; and a pattern comprising a data line 16, a source electrode 17, a drain electrode 18 and a pixel electrode 19, formed on the substrate on which the gate insulating layer 13, the oxide active layer 14 and the etch barrier layer 15 are formed, in which the source electrode 17 is connected with the data line 16 and the drain electrode 18 is connected with the pixel electrode 19.

It should be noted that in the TN type TFT array substrate as shown in FIG. 1a, a portion of the pixel electrode 19 overlaps and contacts the drain electrode 18 and the pixel electrode 19 is directly connected with the drain electrode 18. It should be understood by those skilled in the art that: a passivation layer may also be formed between the pixel electrode 19, and the data line 16 and the source electrode 17 and the drain electrode 18; a through hole is formed in the passivation layer above the drain electrode 18; and the pixel electrode 19 are connected with the drain electrode 18. Alternatively, other structures may also be formed between the pixel electrode 19, and the data line 16 and the source electrode 17 and the drain electrode 18. No specific limitation will be given here in an embodiment of the present invention.

Moreover, in order to reduce the production cost of the TFT array substrate, an embodiment of the present invention further provides another oxide TFT array substrate, wherein a gate line 11 and a data line initial pattern 20 are formed in the same layer.

For instance, the substrate 10 is not only provided with the gate line 11 formed by a gate metal layer film but also provided with the data line initial pattern 20 which is formed by the gate metal layer film, intersected with the gate line 11 and disconnected at a position at which the data line initial pattern 20 is intersected and overlapped with the gate line 11. That is to say, the gate line 11 and the data line initial pattern 20 are disposed in the same layer.

In order to form a pattern of the data line 16, the substrate on which the data line initial pattern 20 is formed is not only provided with the pattern comprising the gate insulating layer 13, the oxide active layer 14 and the etch barrier layer 15 but also provided with a pattern of at least one data line connecting through hole 21 above each section of disconnected data line initial pattern 20.

Figure 2:
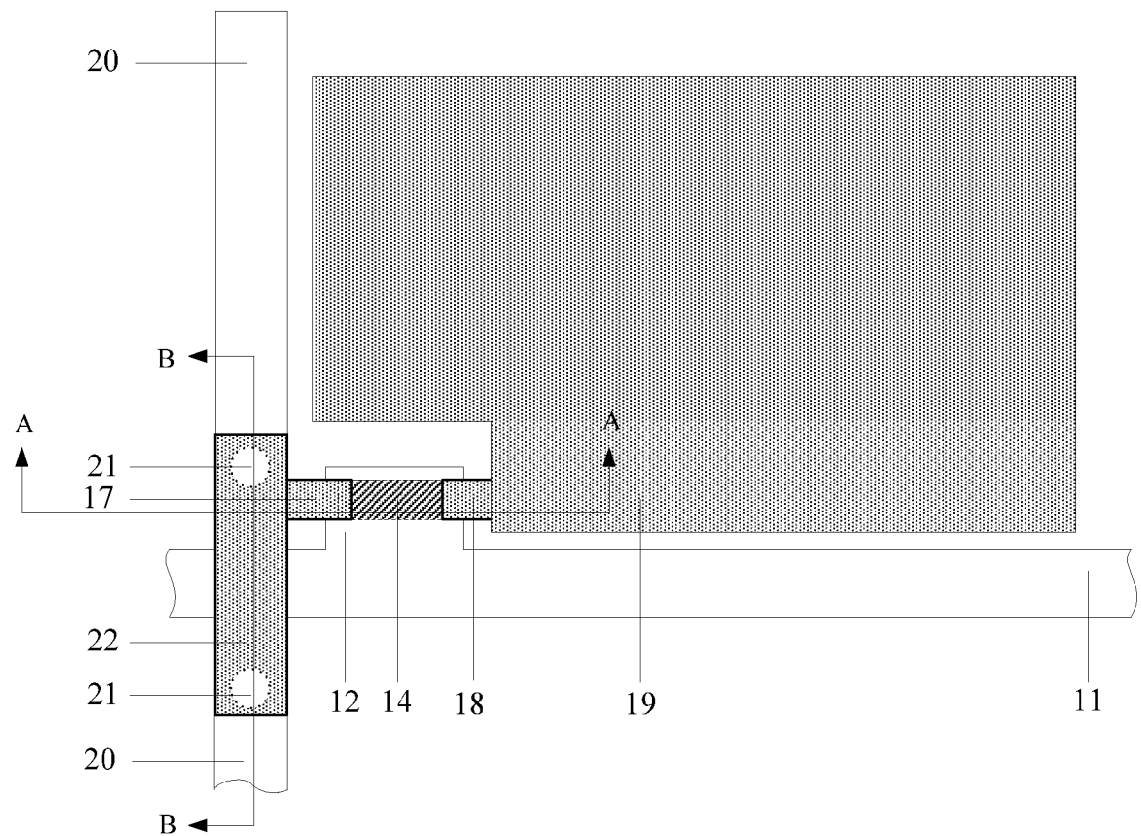
FIG. 2 is a schematic structural top view of another oxide TFT array substrate provided by an embodiment of the present invention.

As illustrated in FIG. 2, the data line connecting through hole 21 is formed above each section of the disconnected data line initial pattern 20. In this case, in order to connect every two adjacent sections of the disconnected data line initial pattern in a column direction, a pattern of the connecting electrode 22 need to cover the pattern of the whole data line 16.

In order to reduce a coverage area of the connecting electrodes 22 on the whole data line 16 so as to reduce a resistance of the data line 16, correspondingly, two data line connecting through holes 21 may be formed above each section of the disconnected data line initial pattern 20. In addition, one data line connecting through hole 21 may be respectively formed above each of both ends of each section of the disconnected data line initial pattern 20.

It should be noted that: a peripheral leading wire region needs to be provided with a pattern comprising a gate line leading wire through hole and a data line leading wire through hole on the substrate on which the data line initial pattern 20 is formed; and the gate line leading wire through hole and the data line leading wire through hole are respectively formed above the gate line 11 and the data line 16. In this case, the substrate on which the gate insulating layer 13, the oxide active layer 14 and the etch barrier layer 15 are formed is not only provided with a pattern comprising a source electrode 17, a drain electrode 18 and a pixel electrode 19 but also provided with the pattern of the connecting electrode 22; every two adjacent sections of the disconnected data line initial pattern 20 are connected with each other by each connecting electrode 22 through every two adjacent data line connecting through holes 21 in a direction intersecting with the gate line 11, and hence the pattern of the data line 16 is formed; the source electrode 17 is connected with the data line 16; and the drain electrode 18 is connected with the pixel electrode 19.

It should be noted that the source electrode 17 is connected with the data line 16 and, for instance, may be connected with the connecting electrode 22 and may also be connected with the data line connecting through hole 21. In order to further reduce the resistance of the data line 16, above each of both ends of each section of the disconnected data line initial pattern 20, one data line connecting through hole 21 is formed, and above each section of the disconnected data line initial pattern 20 which is the nearest to the source electrode 17, one data line connecting through hole 21 also is formed. Therefore, the source electrode 17 may be connected with the data line connecting through hole 21 which is the nearest to the source electrode 17 and is not required to be connected with the connecting electrode 22, and hence the coverage area of the connecting electrode 22 on the whole data line 16 can be reduced.

Correspondingly, it should be understood that a source/drain metal film and a transparent conductive film are filled into the gate line leading wire through hole and the data line leading wire through hole to form a gate line leading wire and a data line leading wire when the pattern comprising the source electrode 17, the drain electrode 18 and the pixel electrode 19 are formed.

Figure 3:
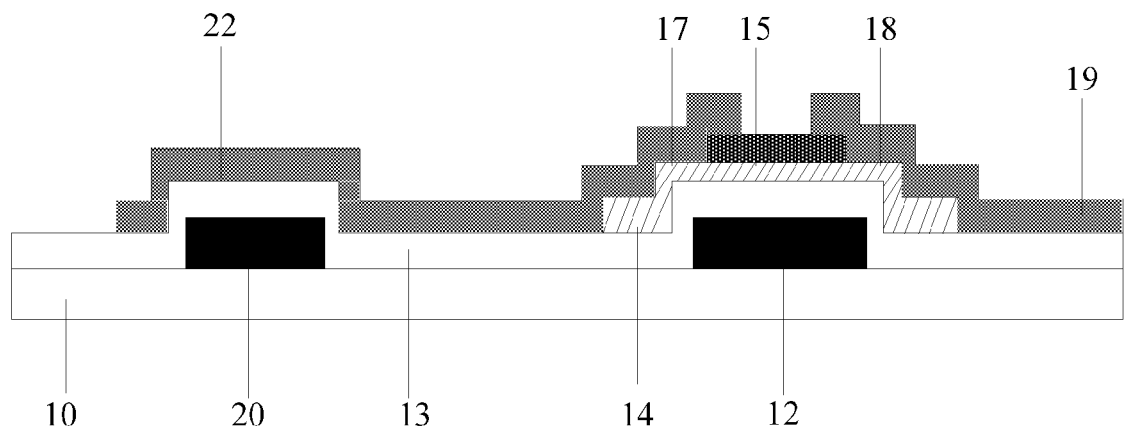
FIG. 3 is a schematic structural sectional view of the oxide TFT array substrate as shown in FIG. 2 along an A-A direction.
Figure 4:
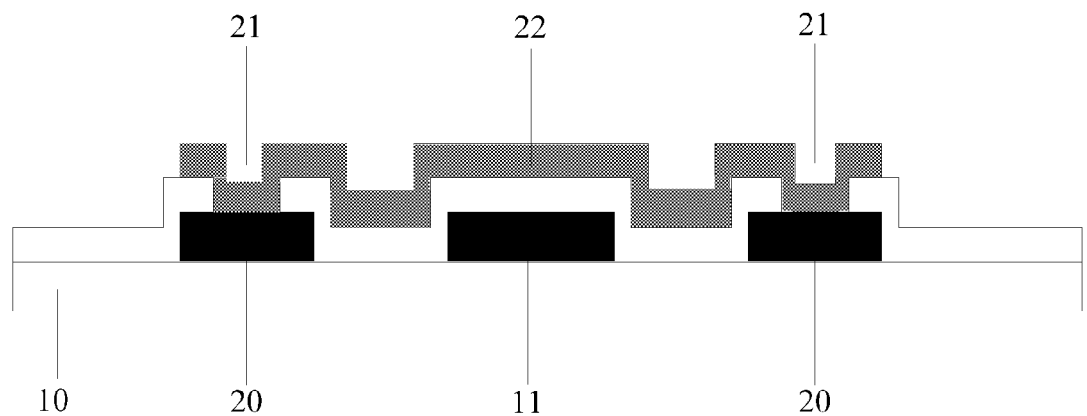
FIG. 4 is a schematic structural sectional view of the oxide TFT array substrate as shown in FIG. 2 along a B-B direction.

For instance, as illustrated in FIGS. 2 to 4, a structure of the oxide TFT array substrate is described in detail by taking a single subpixel of the TN type oxide TFT array substrate as an example.

The oxide TFT array substrate comprises:

a substrate 10;

a gate line 11 and a gate electrode 11 formed by a gate metal layer film and disposed on the substrate 10, and a data line initial pattern 20 intersected with the gate line 11 and disconnected at positions at which the data line initial pattern 20 is intersected and overlapped with the gate line 11, in which the data line initial pattern 20 is disposed in the same layer with the gate line 11 and the gate electrode 12;

a gate insulating layer 13, an oxide active layer 14, an etch barrier layer 15 and data line connecting through holes 21 formed in sequence on the substrate on which the gate line 11, the gate electrode 12 and the data line initial pattern 20 are formed, and a gate line leading wire through hole and a data line leading wire through hole (not shown) formed in a peripheral leading wire region, in which the oxide active layer 14 is disposed above the gate electrode 12; the etch barrier layer 15 is disposed above the oxide active layer 14 and disposed at a channel of an oxide TFT; and the data line connecting through holes 21 are formed above the data line initial pattern 20;

a source electrode 17, a drain electrode 18 and a connecting electrode 22 formed on the substrate on which the pattern comprising the gate insulating layer 13, the oxide active layer 14, the etch barrier layer 15 and the data line connecting through holes 21 are formed, in which as illustrated in FIG. 3, every two adjacent sections of the disconnected data line initial pattern 20 in a column direction are connected with each other by the connecting electrode 22 through every two adjacent data line connecting through holes 21 in the column direction, and hence the pattern of the data line 16 is formed, namely, the data line initial pattern 20, the data line connecting through holes 21 and the connecting electrode 22 are connected with each other to form the data line 16; and the source electrode 17 is connected with the data line 16, for example, the source electrode is extended to the connecting electrode 22 to connect with the data line 16.

In order to increase the aperture ratio of the pixel electrode, the source electrode 17, the drain electrode 18, the pixel electrode 19 and the connecting electrode 22 may be formed on the substrate, on which the pattern comprising the gate insulating layer 13, the oxide active layer 14 and the etch barrier layer 15 are formed, by conductive material of the same layer in the same patterning process, for instance, formed by a transparent conductive film.

Figure 5:
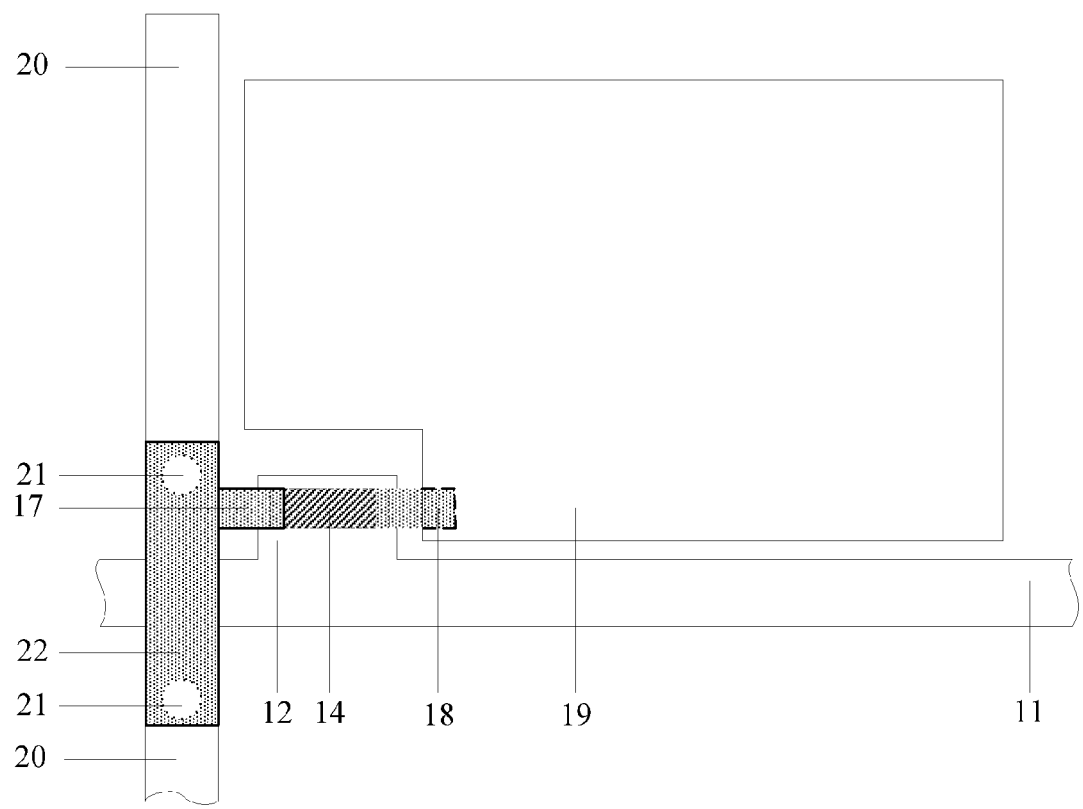
FIG. 5 is a schematic structural top view of still another oxide TFT array substrate provided by an embodiment of the present invention.

It should be noted that FIGS. 2 to 4 only illustrates that the data line 16, the source electrode 17, the drain electrode 18, the pixel electrode 19 and the connecting electrode 22 may be formed by the conductive material of the same layer in the same patterning process; but the structure of the oxide TFT array substrate provided by the embodiment of the present invention is not limited thereto; and as illustrated in FIG. 5, the data line 16, the source electrode 17, the drain electrode 18 and the connecting electrode 22 may be formed by a source/drain metal layer film and hence the pixel electrode 19 is formed by using a transparent conductive film.

Of course, it should be understood by those skilled in the art that: as a conventional technology, after the data line 16, the source electrode 17, the drain electrode 18 and the connecting electrode 22 are formed, a passivation layer may be formed at first and hence the pixel electrode 19 is disposed on the passivation layer. Therefore, no further description will be given in the embodiment of the present invention to the structure of other layers on the data line 16, the source electrode 17, the drain electrode 18 and the connecting electrode 22 of the oxide TFT array substrate.

The embodiment of the present invention provides an oxide TFT array substrate. The array substrate comprises: a substrate; a pattern comprising a gate line and a gate electrode, formed by a gate metal layer film and disposed on the substrate; a pattern comprising a gate insulating layer, an oxide active layer and an etch barrier layer, formed by a gate insulating layer film, an oxide active layer film and an etch barrier layer film respectively and disposed on the substrate on which the gate line and the gate electrode are formed; and a pattern comprising a data line, a source electrode, a drain electrode and a pixel electrode, formed on the substrate on which the gate insulating layer, the oxide active layer and the etch barrier layer are formed, wherein the source electrode is connected with the data line and the drain electrode is connected with the pixel electrode. As the pattern comprising the gate insulating layer, the oxide active layer and the etch barrier layer of the oxide TFT array substrate is formed by one patterning process, the oxide TFT array substrate has a simple production process and low production cost.

Based on the oxide TFT array substrate provided by the above-mentioned embodiments, the embodiment of the present invention provides a manufacturing method of the oxide TFT array substrate. The method comprises:

forming a pattern comprising a gate insulating layer 13, an oxide active layer 14 and an etch barrier layer 15 on a substrate on which a pattern comprising a gate line 11 and a gate electrode 12 are formed, by one patterning process.

For instance, the forming the pattern comprising a gate insulating layer 13, an oxide active layer 14 and an etch barrier layer 15 on a substrate on which a pattern comprising a gate line 11 and a gate electrode 12 are formed by one patterning process comprises:

forming a gate insulating layer film, an oxide active layer film and an etch barrier layer film on the substrate on which the pattern comprising the gate line 11 and the gate electrode 12 are formed;

coating a photoresist on the substrate on which the gate insulating layer film, the oxide active layer film and the etch barrier layer film are formed;

exposing the photoresist by a half-tone mask or a gray-tone mask and forming a photoresist-completely-retained region, a photoresist-half-retained region and a photoresist-completely-removed region after developing, wherein in a pixel unit, the photoresist-completely-retained region corresponds to a region of a pattern of the etch barrier layer 15; the photoresist-half-retained region corresponds to a region of a pattern of the oxide active layer 14 except the pattern of the etch barrier layer; and the photoresist-completely-removed region corresponds to a region except the photoresist-completely-retained region and the photoresist-half-retained region;

removing the oxide active layer film and the etch barrier layer film in the photoresist-completely-removed regions by an etching process, and forming the pattern of the oxide active layer 14;

removing the photoresist in the photoresist-half-retained regions by an ashing process;

removing the etch barrier layer film in the photoresist-half-retained regions by an etching process, and forming the pattern comprising the etch barrier layer 15; and removing the photoresist in the photoresist-completely-retained regions to expose the etch barrier layer 15 and the oxide active layer 14.

For instance, detailed description will be given to the embodiment of the present invention by taking the manufacturing method of the TN type oxide TFT array substrate as an example. It should be noted that the patterning process illustrated in the embodiments of the present invention comprises exposing, developing, etching, ashing and other main processes. A first manufacturing method provided by the embodiments of the present invention will be illustrated at first.

The method comprises:

601: forming a pattern comprising a gate line 11 and a gate electrode 12 on a substrate 10 by a first patterning process.

For instance, in the first patterning process, a gate metal layer film with a thickness of 1000 Å-6000 Å is deposited on the substrate 10 by a magnetron sputtering method or a thermal evaporation method. The gate metal layer film may be made of a metal such as molybdenum, aluminum, aluminum-nickel alloy, molybdenum-tungsten alloy, chromium or copper and may also adopt a combined structure of the above material films Subsequently, a photoresist is formed on the substrate 10 on which the gate metal layer film is formed.

After the photoresist is subjected to exposing and developing by a mask, a photoresist-completely-retained region and a photoresist-completely-removed region are formed. The photoresist-completely-retained region corresponds to a region of the gate line 11 and the gate electrode 12; and the photoresist-completely-removed region corresponds to regions except the photoresist-completely-retained region in a pixel unit.

Figure 6:
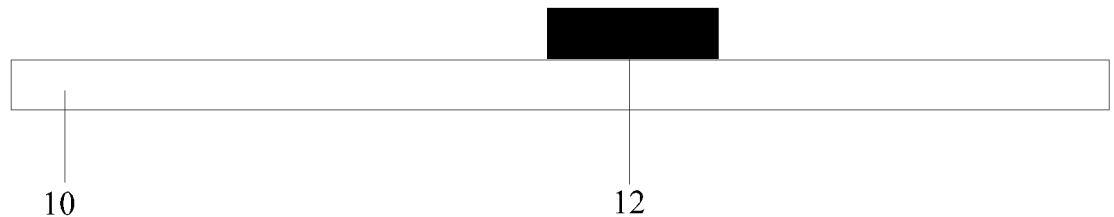
FIG. 6 is a schematic view of a structure obtained after a first patterning process in a first manufacturing method provided by an embodiment of the present invention.

The gate metal layer film is etched by a wet etching process; the gate metal layer film in the photoresist-completely-removed region is removed; the photoresist in the photoresistcompletely-retained region is removed by a peeling process; and as illustrated in FIG. 6, the pattern comprising the gate line 11 and the gate electrode 12 are exposed and hence the gate line 11 and the gate electrode 12 are formed.

602: forming a pattern comprising a gate insulating layer 13, an oxide active layer 14 and an etch barrier layer 15 on the substrate obtained after the first patterning process, by a second patterning process.

After the first patterning process, the pattern comprising the gate line 11 and the gate electrode 12 is formed on the substrate. A gate insulating layer film, an oxide active layer film and an etch barrier layer film are formed on the substrate on which the pattern comprising the gate line 11 and the gate electrode 12 is formed.

For instance, firstly, the gate insulating layer film may be deposited by a plasma enhanced chemical vapor deposition (PECVD) method; secondly, the oxide active layer film may be deposited by a magnetron sputtering method or a thermal evaporation method; and thirdly, the etch barrier layer film may be deposited by a PECVD method. The gate insulating layer film may be made of oxide, nitride, oxynitride or the like. The oxide active layer film may be made of IGZO, gallium indium tin oxide (GITO), indium zinc oxide (IZO) or the like.

Subsequently, a photoresist is coated on the substrate on which the gate insulating layer film, the oxide active layer film and the etch barrier layer film are formed.

The photoresist is exposed by a half-tone mask or a gray-tone mask and a photoresist-completely-retained region, a photoresist-half-retained region and a photoresist-completely-removed region are formed after developing, in which in a pixel unit, the photoresist-completely-retained region corresponds to a region of the etch barrier layer 15; the photoresist-half-retained region corresponds to a region of a pattern comprising the oxide active layer 14 except the pattern of the etch barrier layer 15; and the photoresist-completely-removed region corresponds to a region except the photoresist-completely-retained region and the photoresist-half-retained region.

The etch barrier layer film in the photoresist-completely-removed region is removed by a dry etching process; then, the oxide active layer film is etched by a wet etching process; and hence the pattern comprising the oxide active layer 14 is formed.

The photoresist in the photoresist-half-retained region is removed by an ashing process.

The etch barrier layer film in the photoresist-half-retained region is removed by a dry etching process, and the pattern comprising the etch barrier layer 15 is formed.

Figure 7:
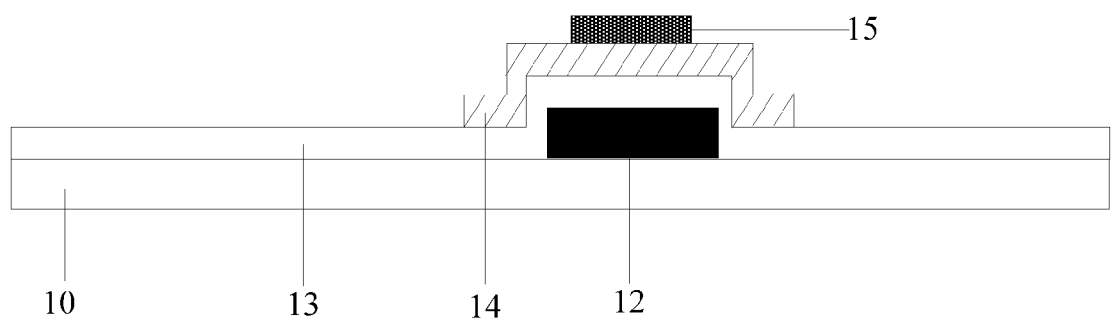
FIG. 7 is a schematic view of a structure obtained after a second patterning process in a first manufacturing method provided by an embodiment of the present invention.

The photoresist in the photoresist-completely-retained region is removed; and as illustrated in FIG. 7, the etch barrier layers 15 and the oxide active layer 14 are exposed.

603: forming a pattern comprising a data line 16, a source electrode 17, a drain electrode 18 and a pixel electrode 19 on the substrate, obtained after the second patterning process, by a patterning process.

For instance, the patterns comprising the data line 16, the source electrode 17 and the drain electrode 18 may be formed on the substrate, obtained after the second patterning process by a third patterning process.

Subsequently, a passivation layer and a through hole are formed on the substrate, obtained after the third patterning process, by a fourth patterning process. The through hole is formed above the drain electrode.

Subsequently, the pixel electrode 19 is formed on the substrate, obtained after the fourth patterning process, by a fifth patterning process, and connected with the drain electrode 18 via the through hole.

Of course, the passivation layer may also be not formed between the data line 16, the source electrode 17, the drain electrode 18 and the pixel electrode 19. Therefore, after the pattern comprising the data line 16, the source electrode 17 and the drain electrode 18 are formed on the substrate, obtained after the second patterning process, by the third patterning process, the pixel electrode 19 is directly formed on the substrate, obtained after the third patterning process, by the fourth patterning process, in which a portion of the pixel electrode 19 overlaps and contacts the drain electrode 18 and is directly connected with the drain electrode 18.

Of course, the data line 16, the source electrode 17, the drain electrode 18 and the pixel electrode 19 on the oxide TFT array substrate may also be manufactured by other methods. No limitation will be given here in the embodiments of the present invention.

Moreover, in order to reduce the production cost of the TFT array substrate, the embodiment of the present invention provides another manufacturing method of the oxide TFT array substrate. In the method, a source electrode 17, a drain electrode 18, a pixel electrode 19 and connecting electrodes 22 are integrally formed by a transparent conductive film. Of course, the source electrode 17, the drain electrode 18 and the connecting electrodes 22 may be formed separately from the pixel electrode 19. No limitation will be given here in the embodiments of the present invention.

More specifically, the manufacturing method of the oxide TFT array substrate comprises:

901: forming a gate line 11, a gate electrode 12 and a data line initial pattern 20 which is intersected with the gate line 11 and disconnected at positions at which the data line initial pattern 20 is intersected and overlapped with the gate line 11, on a substrate by a first patterning process.

For instance, in the first patterning process, a gate metal layer film with a thickness of 1000-6000 Å is deposited on the substrate 10 by a magnetron sputtering method or a thermal evaporation method. The gate metal layer film may be made of a metal such as molybdenum, aluminum, aluminum-nickel alloy, molybdenum-tungsten alloy, chromium or copper and may also adopt a combined structure of the above material films.

Subsequently, a photoresist is formed on the substrate on which the gate metal layer film is formed.

After the photoresist is subjected to exposing and developing by a mask, a photoresist-completely-retained region and a photoresist-completely-removed region are formed. In a pixel unit, the photoresist-completely-retained region corresponds to a pattern comprising the gate line 11, the gate electrode 12 and the data line initial pattern 20, which is intersected with the gate line 11 and disconnected at positions at which the data line initial pattern 20 is intersected and overlapped with the gate line 11; and the photoresist-completely-removed region corresponds to a region except the photoresist-completely-retained region.

The gate metal layer film is etched out by a wet etching process in the photoresist-completely-removed region.

Figure 8A:
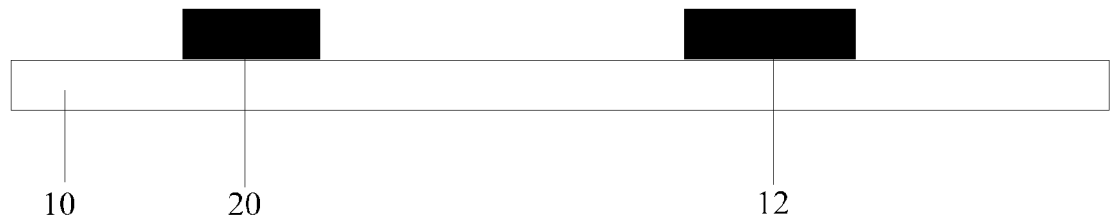
FIG. 8a is a schematic sectional view along a A-A direction of a structure obtained after a first patterning process in a second manufacturing method provided by an embodiment of the present invention.
Figure 8B:
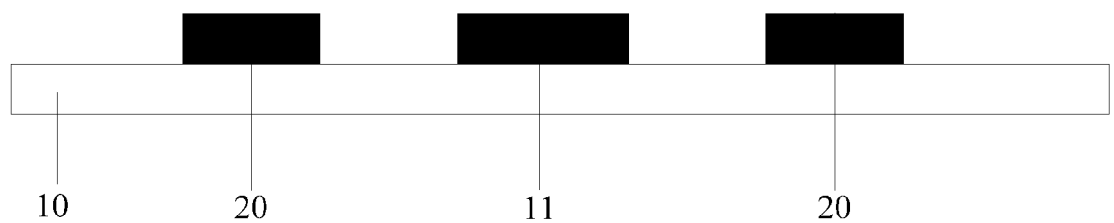
FIG. 8b is a schematic sectional view along a B-B direction of a structure obtained after the first patterning process in the second manufacturing method provided by an embodiment of the present invention.

Subsequently, the photoresist in the photoresist-completely-retained regions is removed by a peeling process; and as illustrated in FIGS. 8a and 8b, the pattern comprising the gate line 11 and the gate electrode 12 and the data line initial pattern 20 is exposed.

902: forming a pattern comprising a gate insulating layer 13, an oxide active layer 14, an etch barrier layer 15 and data line connecting through holes 21 on the substrate, obtained after the first patterning process, by second patterning process.

At least one data line connecting through hole 21 is at least formed above each section of the disconnected data line initial pattern 20.

Figure 9A:
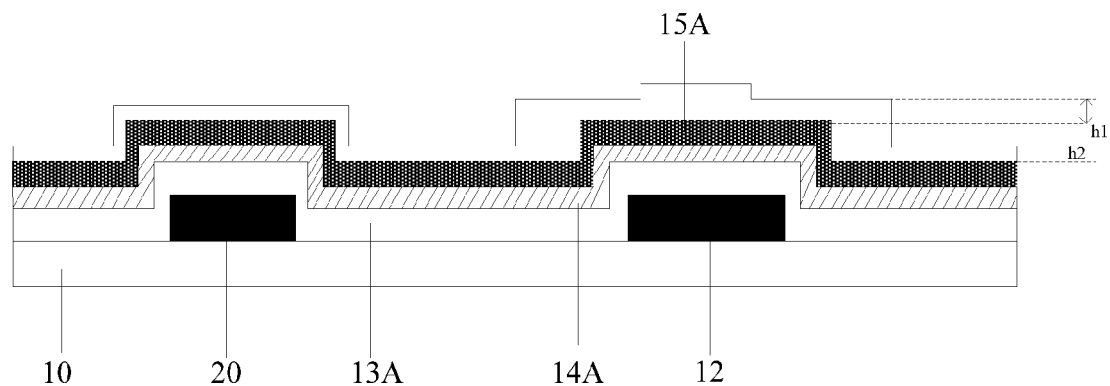
FIG. 9a is a schematic sectional view along a A-A direction of a structure obtained after a second patterning process in the second manufacturing method provided by an embodiment of the present invention.
Figure 9B:
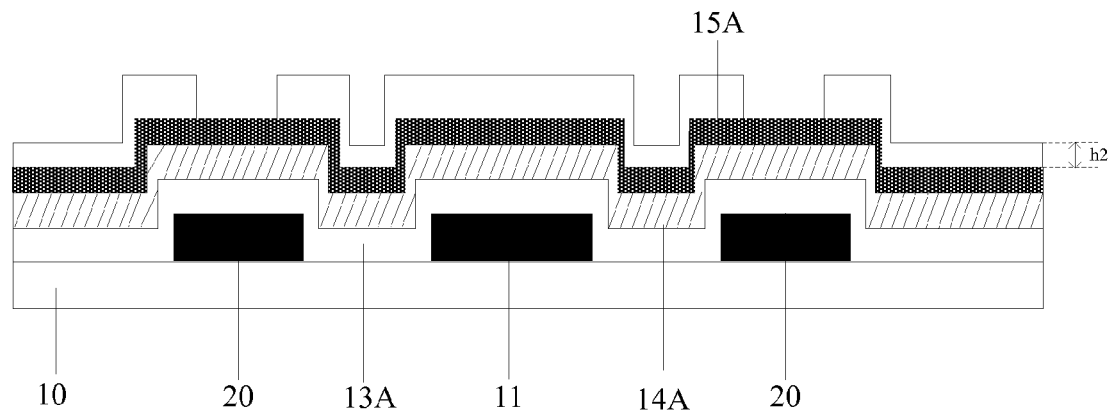
FIG. 9b is a schematic sectional view along a B-B direction of a structure obtained after the second patterning process in the second manufacturing method provided by an embodiment of the present invention.

After the first patterning process, the pattern comprising the gate line 11 and the gate electrode 12 and the data line initial pattern 20 are formed on the substrate; and as illustrated in FIGS. 9a and 9b, a gate insulating layer film 13A, an oxide active layer film 14A and an etch barrier layer film 15A are formed on the substrate on which the pattern comprising the gate line 11 and the gate electrode 12 and the data line initial pattern 20 is formed.

For instance, firstly, the gate insulating layer film 13A may be deposited by a plasma enhanced chemical vapor deposition (PECVD) method; secondly, the oxide active layer film 14A may be deposited by a magnetron sputtering method or a thermal evaporation method; and thirdly, the etch barrier layer film 15A may be deposited by a PECVD method. The gate insulating layer film 13A may be made of oxide, nitride, oxynitride or the like. The oxide active layer film 14A may be made of IGZO, GITO, IZO or the like.

Subsequently, a photoresist is coated on the substrate on which the gate insulating layer film 13A, the oxide active layer film 14A and the etch barrier layer film 15A are formed.

The photoresist is exposed by a half-tone mask or a gray-tone mask; and as illustrated in FIGS. 9a and 9b, a photoresist-completely-retained region, a photoresist-partially-retained region with a first thickness h1, a photoresist-partially-retained region with a second thickness h2 and a photoresist-completely-removed region are formed after developing, in which in a pixel unit, the photoresist-completely-retained region corresponds to a region of the etch barrier layer 15; the photoresist-partially-retained region with the first thickness h1 corresponds to a region of the pattern comprising the oxide active layer 14 except the pattern comprising the etch barrier layer 15; the photoresist-completely-removed region corresponds to a region of the data line connecting through hole 21; the photoresist-partially-retained region with the second thickness h2 corresponds to a region except the photoresist-completely-retained region, the photoresist-partially-retained region with the first thickness h1 and the photoresist-completely-removed region; and the first thickness h1 is greater than the second thickness h2.

Of course, the photoresist-completely-removed region also corresponds to a gate line leading wire through hole and a data line leading wire through hole (not shown in the figure) in a peripheral leading wire region.

For instance, firstly, the etch barrier layer film 15A in the photoresist-completely-removed region is removed by a dry etching process; secondly, the oxide active layer films 14A is etched out by a wet etching process; thirdly, the gate insulating layer film 13A is etched out by a dry etching process, so that the pattern comprising the data line connecting through holes 21 is formed.

Subsequently, the photoresist in the photoresist-partially-retained regions with the second thickness h2 is removed by an ashing process.

The oxide active layer film 14A and the etch barrier layer film 15A in the photoresist-partially-retained region with the second thickness h2 are removed by an etching process, and the pattern comprising the oxide active layer 14 is formed.

The photoresist in the photoresist-partially-retained region with the first thickness h1 is removed by an ashing process.

The etch barrier layer film 15A in the photoresist-partially-retained region with the first thickness h1 is removed by an etching process, and the pattern comprising the etch barrier layer 15 is formed.

Figure 10A:
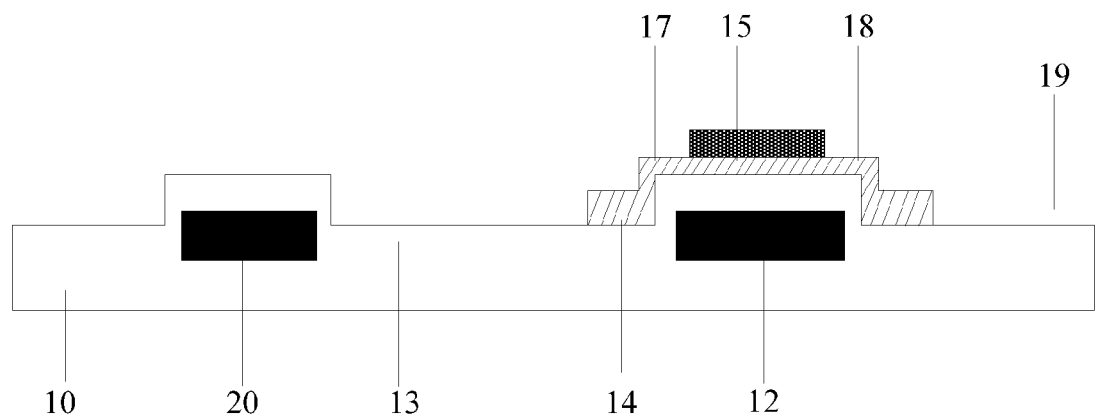
FIG. 10a is a schematic sectional view along a A-A direction of a structure obtained after a third patterning process in the second manufacturing method provided by an embodiment of the present invention.
Figure 10B:
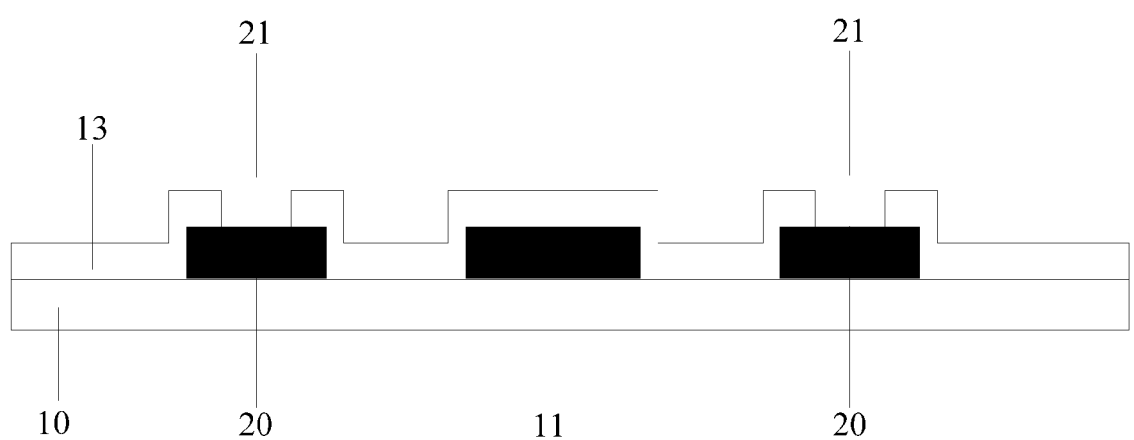
FIG. 10b is a schematic sectional view along a B-B direction of a structure obtained after the third patterning process in the second manufacturing method provided by an embodiment of the present invention.

The photoresist in the photoresist-completely-retained region is removed; and as illustrated in FIGS. 10a and 10b, the pattern comprising the gate insulating layer 13, the oxide active layer 14, the etch barrier layer 15 and the data line connecting through holes 21 is formed.

Optionally, the forming the pattern comprising the gate insulating layer 13, the oxide active layer 14, the etch barrier layer 15 and the data line connecting through holes 21 on the substrate, obtained after the first patterning process, by the second patterning process may further comprise:

forming a gate insulating layer film, an oxide active layer film and an etch barrier layer film on the substrate on which the pattern comprising the gate line 11 and the gate electrode 12 and the data line initial pattern 20 is formed;

coating a photoresist on the substrate on which the gate insulating layer film, the oxide active layer film and the etch barrier layer film are formed;

exposing the photoresist by a gray-tone mask and forming a photoresist-completely-retained region, a photoresist-half-retained region and a photoresist-completely-removed region after developing, in which in a pixel unit, the photoresist-completely-retained region corresponds to a region of the oxide active layer 14; the photoresist-completely-removed region corresponds to a region of the data line connecting through hole 21; and the photoresist-half-retained region corresponds to a region except the photoresist-completely-retained region and the photoresist-completely-removed region;

removing the gate insulating layer film, the oxide active layer film and the etch barrier layer film in the photoresist-completely-removed regions by an etching process, and forming the pattern comprising the data line connecting through holes 21;

removing the photoresist in the photoresist-half-retained region by an ashing process;

removing the oxide active layer film and the etch barrier layer film in the photoresist-half-retained region by an etching process, and forming the pattern comprising the oxide active layer 14;

retaining a portion of the photoresist on the etch barrier layer 15 and removing the photoresist in the photoresist-completely-retained region except region of the etch barrier layer 15 by an ashing process, by the control of the ashing process conditions such as an ashing time;

removing the etch barrier layer film in the photoresist-completely-retained region except the region of the etch barrier layer 15 by an etching process, and forming the pattern comprising the etch barrier layer 15; and removing the photoresist in the region of the etch barrier layer 15.

903: forming a pattern comprising a data line 16, a source electrode 17, a drain electrode 18, connecting electrodes 22 and a pixel electrode 19 on the substrate, obtained after the second patterning process, by a third patterning process.

The step comprises: forming a transparent conductive film on the substrate on which the pattern comprising the gate insulating layer 13, the oxide active layer 14, the etch barrier layer 15 and the data line connecting through holes 21 is formed;

coating a photoresist on the substrate on which the transparent conductive film is formed;

exposing the photoresist by a mask and forming a photoresist-completely-retained region and a photoresist-completely-removed region after developing, in which in a pixel unit, the photoresist-completely-retained region corresponds to a region of the pattern comprising the source electrode 17, the drain electrode 18, the pixel electrode 19 and the connecting electrodes 22; the source electrode 17 is connected with the data line 16 and the drain electrode 17 is connected with the pixel electrode 19; and the photoresist-completely-removed region corresponds to a region except the photoresist-completely-retained region;

removing the transparent conductive film in the photoresist-completely-removed regions by an etching process; and removing the photoresist in the photoresist-completely-retained region, and as illustrated in FIGS. 2 to 4, forming the pattern comprising the source electrode 17, the drain electrode 18 and the pixel electrode 19.

Thus, the oxide TFT array substrate is manufactured.

The embodiment of the present invention provides a manufacturing method of an oxide TFT array substrate. The method comprises: forming a pattern comprising a gate insulating layer, an oxide active layer and an etch barrier layers on a substrate, on which a pattern comprising a gate line and a gate electrode is formed, by one patterning process. In this case, the pattern comprising the gate insulating layer, the oxide active layer and the etch barrier layer can be formed without three patterning processes in the manufacturing process of the oxide TFT array substrate. Therefore, the production period of the oxide TFT array substrate can be reduced; the production process can be simplified; and the production cost can be reduced.

The embodiment of the present invention further provides a display panel, which comprises the oxide TFT array substrate provided by the embodiments.

For instance, the display panel may be a liquid crystal display (LCD) panel and may also be an organic light-emitting diode (OLED) display panel or the like.

It should be understood by those skilled in the art that: all or part of the steps in the method embodiments can be completed by program instruction related hardware; the program can be stored into a computer-readable storage medium and executes the steps of the method embodiments in the executing process; and the storage medium includes: various media capable of storing program codes, such as a read-only memory (ROM), a random-access memory (RAM), a disk or a compact disk (CD).

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A manufacturing method of an oxide thin-film transistor array substrate, comprising:

forming a pattern comprising a gate insulating layer, an oxide active layer and an etch barrier layer on a substrate on which a pattern of a gate line and a gate electrode is formed, by one patterning process, wherein the step of forming the pattern comprising the gate insulating layer, the oxide active layer and the etch barrier layer on the substrate on which the pattern of the gate line and the gate electrode is formed, by one patterning process comprises the following steps:

forming a gate insulating layer film, an oxide active layer film and an etch barrier layer film on the substrate on which the pattern of the gate line and the gate electrode is formed in sequence;

coating a photoresist on the substrate on which the gate insulating layer film, the oxide active layer film and the etch barrier layer film are formed;

exposing the photoresist by a half-tone mask or a gray-tone mask and forming a photoresist-completely-retained region, a photoresist-half-retained region and a photoresist-completely-removed region after developing, wherein in a pixel unit, the photoresist-completely-retained region corresponds to a region of a pattern of the etch barrier layer, the photoresist-half-retained region corresponds to a region of a pattern of the oxide active layer except the region of the pattern of the etch barrier layer, and the photoresist-completely-removed region corresponds to a region except the photoresist-completely-retained region and the photoresist-half-retained region;

removing the oxide active layer film and the etch barrier layer film in the photoresist-completely-removed region by an etching process, and forming the pattern of the oxide active layer;

removing the photoresist in the photoresist-half-retained region by an ashing process;

removing the etch barrier layer film in the photoresist-half-retained regions by an etching process, and forming the pattern of the etch barrier layer; and removing the photoresist in the photoresist-completely-retained region to expose the etch barrier layer and the oxide active layer.

2. The method according to claim 1, wherein before the forming the pattern comprising the gate insulating layer, the oxide active layer and the etch barrier layer, the method further comprises:

forming the pattern of the gate line and the gate electrode on the substrate by one patterning process, and meanwhile forming a data line initial pattern, which is intersected with the gate line and disconnected at positions at which the data line initial pattern is intersected and overlapped with the gate line, by the one patterning process; and forming at least one data line connecting through hole above each section of the disconnected data line initial pattern by the patterning process, in the patterning process of forming the gate insulating layer, the oxide active layer and the etch barrier layer.

3. The method according to claim 2, wherein after the forming the pattern comprising the gate insulating layer, the oxide active layer and the etch barrier layer, the method further comprises:

forming a pattern comprising a data line, a source electrode, a drain electrode, a connecting electrode and a pixel electrode on the substrate on which the pattern comprising the gate insulating layer, the oxide active layer and the etch barrier layer is formed, by a patterning process, in which every two adjacent sections of the disconnected data line initial pattern are connected with each other by the connecting electrode through every two adjacent data line connecting through holes in a direction intersected with the gate line, and hence a pattern of the data line is formed; and the source electrode is connected with the data line and the drain electrode is connected with the pixel electrode.

4. The method according to claim 3, wherein the forming the pattern comprising the gate line and the gate electrode on the substrate by one patterning process, and meanwhile forming the data line initial pattern, which is intersected with the gate line and disconnected at positions at which the data line initial pattern is intersected and overlapped with the gate line, by the one patterning process comprises:

forming a gate metal layer film on the substrate;

coating a photoresist on the substrate on which the gate metal layer film is formed;

exposing the photoresist by a mask and forming a photoresist-completely-removed region and a photoresist-completely-retained region after developing, in which in a pixel unit, the photoresist-completely-retained region corresponds to the pattern of the gate line and the gate electrode and the data line initial pattern; and the photoresist-completely-removed region corresponds to a region except the photoresist-completely-retained region;

removing the gate metal layer film in the photoresist-completely-removed region by an etching process; and removing the photoresist in the photoresist-completely-retained region to expose the pattern of the gate line and the gate electrode and the data line initial pattern.

5. The method according to claim 3, wherein the forming at least one data line connecting through hole above each section of the disconnected data line initial pattern by the patterning process, in the patterning process of forming the gate insulating layer, the oxide active layer and the etch barrier layer, comprises:

forming a gate insulating layer film, an oxide active layer film and an etch barrier layer film on the substrate on which the pattern of the gate line and the gate electrode and the data line initial pattern are formed;

coating a photoresist on the substrate on which the gate insulating layer film, the oxide active layer film and the etch barrier layer film are formed;

exposing the photoresist by a gray-tone mask and forming a photoresist-completely-retained region, a photoresist-partially-retained region with a first thickness, a photoresist-partially-retained region with a second thickness and a photoresist-completely-removed region after developing, in which in a pixel unit, the photoresist-completely-retained region corresponds to a region of a pattern of the etch barrier layer; the photoresist-partially-retained region with the first thickness corresponds to a region of the pattern of the oxide active layer except the pattern of the etch barrier layer; the photoresist-completely-removed region corresponds to a region of a pattern of the data line connecting through holes; the photoresist-partially-retained region with the second thickness corresponds to a region except the photoresist-completely-retained region, the photoresist-partially-retained region with the first thickness and the photoresist-completely-removed region; and the first thickness is greater than the second thickness;

removing the gate insulating layer film, the oxide active layer film and the etch barrier layer film in the photoresist-completely-removed region by an etching process, and forming the pattern of the data line connecting through holes;

removing the photoresist in the photoresist-partially-retained regions with the second thickness by an ashing process;

removing the oxide active layer film and the etch barrier layer film in the photoresist-partially-retained region with the second thickness by an etching process, and forming the pattern of the oxide active layer;

removing the photoresist in the photoresist-partially-retained regions with the first thickness by an ashing process;

removing the etch barrier layer film in the photoresist-partially-retained region with the first thickness by an etching process, and forming the pattern of the etch barrier layer; and removing the photoresist in the photoresist-completely-retained region.

6. The method according to claim 3, wherein the forming at least one data line connecting through hole above each section of the disconnected data line initial pattern by the patterning process, in the patterning process of forming the gate insulating layer, the oxide active layer and the etch barrier layer, comprises:

forming a gate insulating layer film, an oxide active layer film and an etch barrier layer film on the substrate on which the pattern of the gate line and the gate electrode and the data line initial pattern are formed;

coating a photoresist on the substrate on which the gate insulating layer film, the oxide active layer film and the etch barrier layer film are formed;

exposing the photoresist by a gray-tone mask and forming a photoresist-completely-retained region, a photoresist-half-retained region and a photoresist-completely-removed regions after developing, in which in a pixel unit, the photoresist-completely-retained region corresponds to a region of a pattern of the oxide active layer; the photoresist-completely-removed region corresponds to a region of a pattern of the data line connecting through holes; and the photoresist-half-retained region corresponds to a region except the photoresist-completely-retained region and the photoresist-completely-removed region;

removing the gate insulating layer film, the oxide active layer film and the etch barrier layer film in the photoresist-completely-removed region by an etching process, and forming the pattern of the data line connecting through holes;

removing the photoresist in the photoresist-half-retained regions by an ashing process;

removing the oxide active layer film and the etch barrier layer film in the photoresist-half-retained region by an etching process to form the pattern of the oxide active layer;

retaining a portion of the photoresist in the region of the pattern of the etch barrier layer and removing the photoresist in the photoresist-completely-retained region except the region of the pattern of the etch barrier layer, by the control of an ashing process conditions;

removing the etch barrier layer film in the photoresist-completely-retained region except the region of the etch barrier layer by an etching process to form the pattern of the etch barrier layer; and removing the photoresist in the region of the pattern of the etch barrier layer.

7. The method according to claim 2, wherein the forming the pattern comprising the gate line and the gate electrode on the substrate by one patterning process, and meanwhile forming the data line initial pattern, which is intersected with the gate line and disconnected at positions at which the data line initial pattern is intersected and overlapped with the gate line, by the one patterning process comprises:

forming a gate metal layer film on the substrate;

coating a photoresist on the substrate on which the gate metal layer film is formed;

exposing the photoresist by a mask and forming a photoresist-completely-removed region and a photoresist-completely-retained region after developing, in which in a pixel unit, the photoresist-completely-retained region corresponds to the pattern of the gate line and the gate electrode and the data line initial pattern; and the photoresist-completely-removed region corresponds to a region except the photoresist-completely-retained region;

removing the gate metal layer film in the photoresist-completely-removed region by an etching process; and removing the photoresist in the photoresist-completely-retained region to expose the pattern of the gate line and the gate electrode and the data line initial pattern.

8. The method according to claim 2, wherein the forming at least one data line connecting through hole above each section of the disconnected data line initial pattern by the patterning process, in the patterning process of forming the gate insulating layer, the oxide active layer and the etch barrier layer, comprises:

forming a gate insulating layer film, an oxide active layer film and an etch barrier layer film on the substrate on which the pattern of the gate line and the gate electrode and the data line initial pattern are formed;

coating a photoresist on the substrate on which the gate insulating layer film, the oxide active layer film and the etch barrier layer film are formed;

exposing the photoresist by a gray-tone mask and forming a photoresist-completely-retained region, a photoresist-partially-retained region with a first thickness, a photoresist-partially-retained region with a second thickness and a photoresist-completely-removed region after developing, in which in a pixel unit, the photoresist-completely-retained region corresponds to a region of a pattern of the etch barrier layer; the photoresist-partially-retained region with the first thickness corresponds to a region of the pattern of the oxide active layer except the pattern of the etch barrier layer; the photoresist-completely-removed region corresponds to a region of a pattern of the data line connecting through holes; the photoresist-partially-retained region with the second thickness corresponds to a region except the photoresist-completely-retained region, the photoresist-partially-retained region with the first thickness and the photoresist-completely-removed region; and the first thickness is greater than the second thickness;

removing the gate insulating layer film, the oxide active layer film and the etch barrier layer film in the photoresist-completely-removed region by an etching process, and forming the pattern of the data line connecting through holes;

removing the photoresist in the photoresist-partially-retained regions with the second thickness by an ashing process;

removing the oxide active layer film and the etch barrier layer film in the photoresist-partially-retained region with the second thickness by an etching process, and forming the pattern of the oxide active layer;

removing the photoresist in the photoresist-partially-retained regions with the first thickness by an ashing process;

removing the etch barrier layer film in the photoresist-partially-retained region with the first thickness by an etching process, and forming the pattern of the etch barrier layer; and removing the photoresist in the photoresist-completely-retained region.

9. The method according to claim 2, wherein the forming at least one data line connecting through hole above each section of the disconnected data line initial pattern by the patterning process, in the patterning process of forming the gate insulating layer, the oxide active layer and the etch barrier layer, comprises:

forming a gate insulating layer film, an oxide active layer film and an etch barrier layer film on the substrate on which the pattern of the gate line and the gate electrode and the data line initial pattern are formed;

coating a photoresist on the substrate on which the gate insulating layer film, the oxide active layer film and the etch barrier layer film are formed;

exposing the photoresist by a gray-tone mask and forming a photoresist-completely-retained region, a photoresist-half-retained region and a photoresist-completely-removed regions after developing, in which in a pixel unit, the photoresist-completely-retained region corresponds to a region of a pattern of the oxide active layer; the photoresist-completely-removed region corresponds to a region of a pattern of the data line connecting through holes; and the photoresist-half-retained region corresponds to a region except the photoresist-completely-retained region and the photoresist-completely-removed region;

removing the gate insulating layer film, the oxide active layer film and the etch barrier layer film in the photoresist-completely-removed region by an etching process, and forming the pattern of the data line connecting through holes;

removing the photoresist in the photoresist-half-retained regions by an ashing process;

removing the oxide active layer film and the etch barrier layer film in the photoresist-half-retained region by an etching process to form the pattern of the oxide active layer;

retaining a portion of the photoresist in the region of the pattern of the etch barrier layer and removing the photoresist in the photoresist-completely-retained region except the region of the pattern of the etch barrier layer, by the control of an ashing process conditions;

removing the etch barrier layer film in the photoresist-completely-retained region except the region of the etch barrier layer by an etching process to form the pattern of the etch barrier layer; and removing the photoresist in the region of the pattern of the etch barrier layer.

10. The method according to claim 2, wherein the forming the pattern of the data line, the source electrode, the drain electrode, the connecting electrode and the pixel electrode on the substrate, on which the gate insulating layer, the oxide active layer and the etch barrier layer are formed, by a patterning process comprises:

forming the pattern of the data line, the source electrode, the drain electrode, the connecting electrode and the pixel electrode by one patterning process.

11. The method according to claim 10, wherein the forming the pattern of the data line, the source electrode, the drain electrode, the connecting electrode and the pixel electrode by one patterning process comprises:

forming a transparent conductive film on the substrate on which the gate insulating layer, the oxide active layer, the etch barrier layer and the data line connecting through holes are formed;

coating a photoresist on the substrate on which the transparent conductive film is formed;

exposing the photoresist by a mask and forming a photoresist-completely-retained region and a photoresist-completely-removed region after developing, in which in a pixel unit, the photoresist-completely-retained region corresponds to a region of the pattern of the source electrode, the drain electrode, the pixel electrode and the connecting electrode; the source electrode is connected with the data line and the drain electrode is connected with the pixel electrode; and the photoresist-completely-removed region corresponds to a region except the photoresist-completely-retained region;

removing the transparent conductive film in the photoresist-completely-removed region by an etching process, and forming the pattern of the source electrode, the drain electrode and the pixel electrode; and removing the photoresist in the photoresist-completely-retained region.

12. An oxide thin film transistor (TFT) array substrate, comprising:

a substrate;

a pattern of a gate line and a gate electrode, formed by a gate metal layer film and disposed on the substrate;

a pattern of a gate insulating layer, an oxide active layer and an etch barrier layer, formed by a gate insulating layer film, an oxide active layer film and an etch barrier layer film respectively and disposed on the substrate on which the gate line and the gate electrode are formed; and a pattern of a data line, a source electrode, a drain electrode and a pixel electrode, formed on the substrate on which the gate insulating layer, the oxide active layer and the etch barrier layer are formed, in which the source electrode is connected with the data line and the drain electrode is connected with the pixel electrode, wherein a data line initial pattern which is formed by the gate metal layer film, intersected with the gate line and disconnected at positions at which the data line initial pattern is intersected and overlapped with the gate line is formed on the substrate;

a pattern of at least one data line connecting through hole is formed above each section of the disconnected data line initial pattern, on the substrate on which the gate line and the gate electrode are formed;

a pattern of a connecting electrode is also formed on the substrate on which the pattern of the gate insulating layer, the oxide active layer and the etch barrier layer is formed; and every two adjacent section of the disconnected data line initial pattern are connected with each other by each connecting electrode through every two adjacent data line connecting through holes in a direction intersected with the gate line, and hence a pattern of the data line is formed.

13. The array substrate according to claim 12, wherein the source electrode, the drain electrode, the pixel electrode and the connecting electrode are formed by a transparent conductive film.

14. The array substrate according to claim 13, wherein the source electrode, the drain electrode, the pixel electrode and the connecting electrode are disposed in the same layer.

15. The array substrate according to claim 13, wherein the gate line, the gate electrode and the data line initial pattern are disposed in the same layer.

16. The array substrate according to claim 12, wherein the gate line, the gate electrode and the data line initial pattern are disposed in the same layer.

17. A display panel, comprising the oxide TFT array substrate according to claim 12.

* * * * *